US008063436B2

(12) United States Patent
Bhattacharyya et al.

(10) Patent No.: US 8,063,436 B2
(45) Date of Patent: Nov. 22, 2011

(54) MEMORY CELLS CONFIGURED TO ALLOW FOR ERASURE BY ENHANCED F-N TUNNELING OF HOLES FROM A CONTROL GATE TO A CHARGE TRAPPING MATERIAL (75) Inventors: Arup Bhattacharyya, Essex Junction, VT (US); Kirk D. Prall, Boise, ID (US); Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/829,904

(22) Filed: Jul. 2, 2010

(65) Prior Publication Data

US 2010/0264482 A1 Oct. 21, 2010

Related U.S. Application Data (63) Continuation of application No. 11/900,595, filed on Sep. 12, 2007, now Pat. No. 7,749,848, which is a continuation of application No. 11/127,618, filed on May 12, 2005, now Pat. No. 7,279,740.

(51) Int. Cl.
*H01L 29/792* (2006.01)
(52) U.S. Cl. .................. 257/324; 257/E21.679
(58) Field of Classification Search .................. 257/324, 257/E21.679
See application file for complete search history.

(56) References Cited

U.S. PATENT DOCUMENTS

| 4,870,470 | A | 9/1989 | Bass, Jr. et al. |
|---|---|---|---|
| 5,886,368 | A | 3/1999 | Forbes et al. |
| 6,514,828 | B2 | 2/2003 | Ahn et al. |
| 6,586,797 | B2 | 7/2003 | Forbes et al. |
| 6,664,589 | B2 | 12/2003 | Forbes et al. |
| 6,713,810 | B1 | 3/2004 | Bhattacharyya |
| 6,743,681 | B2 | 6/2004 | Bhattacharyya |
| 6,754,108 | B2 | 6/2004 | Forbes |
| 6,759,712 | B2 | 7/2004 | Bhattacharyya |
| 6,768,156 | B1 | 7/2004 | Bhattacharyya |
| 6,778,441 | B2 | 8/2004 | Forbes et al. |
| 6,784,480 | B2 | 8/2004 | Bhattacharyya |
| 6,849,464 | B2 | 2/2005 | Drewes |
| 6,864,139 | B2 | 3/2005 | Forbes |
| 6,900,455 | B2 | 5/2005 | Drewes |
| 6,903,969 | B2 | 6/2005 | Bhattacharyya |
| 6,917,078 | B2 | 7/2005 | Bhattacharyya |
| 6,933,572 | B2 | 8/2005 | Bhattacharyya |
| 7,279,740 | B2 | 10/2007 | Bhattacharyya et al. |

(Continued)

OTHER PUBLICATIONS

M. Kwan Cho et al., High Performance SONOS Memory Cells Free of Drain Turn-On and Over-Erase: Compatibility Issue with Current Flash Technology, IEEE Electron Device Letters, vol. 21, No. 8, Aug. 2000, pp. 399-401.
F. Ito et al., A Novel MNOS Technology Using Gate Hole Injection in Erase Operation for Embedded Nonvolatile Memory Applications, VLSI Technology Digest of Technical Papers, 2004, pp. 80-81.
M. Fukuda et al., Scaled 2 bit/cell SONOS Type Nonvolatile Memory Technology for sub-90nm Embedded Application using SiN Sidewall Trapping Structure, IEDM, 2003, pp. 37.5.1-37.5.4.

(Continued)

*Primary Examiner* — Bradley K Smith
*Assistant Examiner* — Amar Movva
(74) *Attorney, Agent, or Firm* — Leffert Jay & Polglaze, P.A.

(57) ABSTRACT

Memory cells including a control gate, a charge trapping material, and a charge blocking material between the control gate and the charge trapping material. The charge blocking material is configured to allow for erasure of the memory cell by enhanced F-N tunneling of holes from the control gate to the charge trapping material.

20 Claims, 6 Drawing Sheets

U.S. PATENT DOCUMENTS

| | | |
|---|---|---|
| 2003/0001232 A1 | 1/2003 | Koinuma et al. |
| 2003/0042527 A1 | 3/2003 | Forbes et al. |
| 2003/0042532 A1 | 3/2003 | Forbes |
| 2003/0042534 A1 | 3/2003 | Bhattacharyya |
| 2003/0043632 A1 | 3/2003 | Forbes |
| 2003/0043633 A1 | 3/2003 | Forbes et al. |
| 2003/0043637 A1 | 3/2003 | Forbes et al. |
| 2003/0045082 A1 | 3/2003 | Eldridge et al. |
| 2003/0048666 A1 | 3/2003 | Eldridge et al. |
| 2003/0089942 A1 | 5/2003 | Bhattacharyya |
| 2004/0121534 A1* | 6/2004 | Lin et al. .................. 438/257 |
| 2005/0006696 A1 | 1/2005 | Noguchi et al. |
| 2005/0074937 A1* | 4/2005 | Jung .......................... 438/257 |

OTHER PUBLICATIONS

C.C. Yeh et al., Novel Operation Schemes to Improve Device Reliability in a Localized Trapping Storage SONOS-type Flash Memory, IEDM, 2003, pp. 7.5.1-7.5.4.

K.W. Guarini et al., Low voltage scalable nanocrystal FLASH memory fabricated by templated self assembly, IEDM, 2003, pp. 22.2.1-22.2.4.

S.J. Baik et al., High Speed and Nonvolatile Si Nanocrystal Memory for Scaled Flash Technology using Highly Field-Sensitive Tunnel Barrier, IEDM, 2003, pp. 22.3.1-22.3.4.

* cited by examiner

MEMORY CELLS CONFIGURED TO ALLOW FOR ERASURE BY ENHANCED F-N TUNNELING OF HOLES FROM A CONTROL GATE TO A CHARGE TRAPPING MATERIAL

RELATED APPLICATIONS

This application is a continuation of U.S. patent application Ser. No. 11/900,595 (allowed), filed Sep. 12, 2007 now U.S. Pat. No. 7,749,848 and titled "BAND-ENGINEERED MULTI-GATED NON-VOLATILE MEMORY DEVICE WITH ENHANCED ATTRIBUTES," which is a continuation of U.S. patent application Ser. No. 11/127,618 (now U.S. Pat. No. 7,279,740), filed May 12, 2005 and titled "BAND-ENGINEERED MULTI-GATED NON-VOLATILE MEMORY DEVICE WITH ENHANCED ATTRIBUTES," each of which is commonly assigned and incorporated by reference in its entirety herein.

TECHNICAL FIELD

The present invention relates generally to integrated circuits and in particular the present invention relates to non-volatile memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates. Data is stored in the memory cells in the form of charge on the floating gates or floating nodes associated with the gates. Each of the cells within an EEPROM memory array can be electrically programmed in a random basis by charging the floating node. The charge can also be randomly removed from the floating node by an erase operation. Charge is transported to or removed from the individual floating nodes by specialized programming and erase operations, respectively.

Yet another type of non-volatile memory is a Flash memory. A Flash memory is a type of EEPROM that is typically erased and reprogrammed in blocks instead of a single bit or one byte (8 or 9 bits) at a time. A typical Flash memory comprises a memory array, which includes a large number of memory cells. Each of the memory cells includes a floating gate field-effect transistor (FET) capable of holding a charge. The data in a cell is determined by the presence or absence of the charge in the floating gate/charge trapping layer. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

Floating gate memory cells are typically programmed by injecting electrons to the floating gate by channel hot carrier injection (CHE), placing the cell in a high threshold voltage state. Floating gate memory cells can also be erased by hot hole injection from the substrate. Alternatively, floating gate memory cells can be programmed and erased by electron tunneling from and to the substrate by Fowler-Nordheim tunneling to put the cell in a programmed or erased threshold state. Both mechanisms require the generation of high positive and negative voltages in the memory device and can place high fields across the gate insulation layers with resulting adverse effects in device characteristics and reliability.

A problem with CHE, hot hole injection and Fowler-Nordheim tunneling is that the high energy required for their operation damages the device materials, reducing memory cell lifetimes and endurance. They can also consume large amounts of power, which is a problem in portable devices. CHE electron injection can generate interface states, degrade device transconductance, and enhance back-tunneling that affects charge retention and read-disturb. Fowler-Nordheim tunneling and hot hole injection can generate fixed charge centers in the tunneling insulators and shallow traps and defects in the trapping layer, thus breaking stable bonds and eventually degrading the insulator/dielectric properties of the device.

For the reasons stated above, and for other reasons stated below which will become apparent to those skilled in the art upon reading and understanding the present specification, there is a need in the art for methods and apparatus for a floating gate memory cell that allows for low voltage direct tunneling programming and low voltage fast erasure with high charge retention and enhanced endurance.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of band-gap engineered gate stacks with asymmetric tunnel barriers in floating gate memory cells. These asymmetric tunnel barrier floating gate memory cells allow for direct tunneling programming and efficient erase with electrons and holes utilizing reduced programming voltages in NOR or NAND architecture memories. The asymmetric band-gap gate memory cell stack also contains high charge blocking barriers to prevent back-tunneling of carriers and has deep carrier trapping sites for good charge retention. The direct tunneling program and low voltage erase capability reduces damage to the gate insulator stack and the associated crystal lattice from high energy carriers, which reduces write fatigue and lattice damage induced leakage issues, enhancing overall device lifespan. Memory cell embodiments of the present invention also allow multiple bit storage in a single memory cell, and allow for programming and erase with single polarity voltages applied across the gate stack.

As stated above, conventional floating gate memory cells of the prior art are typically Field Effect Transistor (FET) devices. These devices are typically formed as three terminal devices having a source, drain and control gate connections. In a typical floating gate memory cell source and drain regions separated by a channel region of an opposite impurity doping are formed in an impurity doped silicon substrate (a typical NFET transistor would have N+ doped source/drain regions in a P doped substrate, a PFET transistor would have P+ source/drains in a N doped substrate). The gate stack of the floating gate or floating node memory cell is typically formed over the channel region and/or portions of the source and drain regions and typically comprises successive layers of tunnel insulation, a floating gate or floating node, a charge blocking insulation layer and the control gate. The gate stack allows control of the formation of minority carriers in the channel and the flow of carriers from the source to the drain through the channel via the voltage applied to the control gate. The floating gate or floating node is typically formed of a conductive material (such as polysilicon as a floating gate) or a non-conductive charge trapping layer (such as a nitride floating gate) and is electrically isolated between the tunnel and charge blocking insulation layers. The control gate is typically formed of aluminum, tungsten or polysilicon. A conductive underlayer may optionally be applied before depositing the control gate, which acts as a chemical passivation layer. This passivation layer typically consists of a thin film of TaN, TiN or HfN. The electrical structure of a non-floating gate FET between the channel and the control gate is that of a capacitor, sufficient voltage applied across the control gate and the channel will form a channel of carriers and the FET will conduct current from its source to drain region. In a floating gate memory cell FET, the electrical structure formed between the channel, floating gate and control gate is equivalent to that of two series coupled capacitors. Because of this, charge placed/trapped on the floating gate by moving carriers through the insulation layers (via charge injection or tunneling) alters the effective threshold voltage (Vth) of the floating gate memory cell FET (the voltage applied across the control gate and the channel at which a channel of carriers is formed in the channel region and the FET begins to conduct current from its source to drain region). This ability to alter the threshold voltage by trapping or removing charge from the floating gate allows data values to be stored in the floating gate memory cell and read by sensing the differing current flows through the memory cell FET from its source to drain in its programmed and unprogrammed state. The floating node memory cell FET operates similar to the floating gate memory cell FET, except that the charges are stored in a non-conductive trapping layer replacing the floating gate. It is noted that some floating node memory cells with non-conductive trapping layer, such as NROM, allow the storage of more than one bit of data in a memory cell by trapping carriers near and above each source/drain region, allowing the differing bits of data to be read by switching which source/drain region is electrically used as the source or drain.

The insulation layers of conventional floating gate memory cell FETs must have sufficient charge blocking ability for the memory cell to allow for required charge retention period. In conventional floating gate memory cells, this is accomplished by forming the insulation layers (also known as oxide layers due to the most common forms of insulator materials utilized) of materials with sufficient thickness and high conduction bands to be effective tunnel barriers, preventing leakage and back-tunneling of the trapped charge. Because of these high insulator thicknesses and tunnel barriers, the effective oxide thickness of the FET from the control gate to the channel is relatively high and therefore the voltages that must be utilized in programming and/or erasing conventional floating gate memory cells (10V to 20 v) are typically significantly higher than the supply voltages of the device (1.2V to 5V) and must therefore be internally generated with charge pump circuits. This use of high voltage requires specialized design and layout, and can increase the size of the resulting memory by as much as 40% and places limits on feature reductions for the part as manufacturing processes improve. In addition, the increased energy utilized in erase and program increases the power requirements of the memory device and can increase damage to the material of the insulator layers, leading to increased charge leakage and a shorter useful life (a smaller number of overall program/erase cycles) for the part. It is noted that high K dielectric insulators have been introduced in many recent floating gate memories to compensate for reduced insulator layer thickness and allow for reduction in feature sizes.

The conventional floating gate memory cells and devices discussed above involve high energy ("hot") charge transport between the substrate and the floating gate for programming and erasure, known as channel hot electron (CHE) or hot hole injection. In CHE/hot hole programming and erasure, the field placed across the control gate and the channel is high enough to inject carriers (hole/electrons) to or from the channel to the floating gate across the tunnel insulator layer. Part of the energy of the hot carriers is transferred to the interface lattice between the silicon substrate and the gate oxide. As a result, interface bonds break and interface characteristics get degraded after multiple write-erase cycles. Consequently, the hot charge transport generates surface states at the silicon-oxide interface and creates local weak spots in the gate oxide that negatively affects the device by degrading the FET transconductance (Gm), enhancing the stored charge loss from the floating gate (i.e. retention loss), and reducing the endurance (i.e. operable write-erase cycles) of the device.

Fowler-Nordheim Tunneling operates by quantum mechanical tunneling of the carriers through the conduction barriers of the insulator layers to place or remove the carriers to or from the floating gate/trapping layer of the memory cell. As a result, Fowler-Nordheim tunneling takes place at reduced fields and voltages than CHE or hot hole injection. However, as an elevated voltage is required to boost the electrical field to the levels needed to induce tunneling, the high energy acquired by the carriers still can induce damage of the device materials, reducing memory cell endurance and effective device lifetimes. In particular, Fowler-Nordheim tunneling can generate fixed charge centers in the tunneling insulators and shallow traps and defects in the trapping layer, thus breaking stable bonds and eventually degrading the dielectric properties of the insulators of the device. Due to the high voltages and currents required, power consumption during programming and erasure is also still significant factor in Fowler-Nordheim tunneling devices.

Embodiments of the present invention utilize band-gap engineered gate-stacks that allow low voltage program and erase of the memory cells via direct tunneling of carriers to or from the floating gate/trapping layer of the individual floating gate memory cell FETs for both single and multi-bit data storage. In direct tunneling of carriers, the carriers are directly tunneled into the floating gate/trapping layer under low energy conditions. Direct tunneling has not typically utilized in floating gate memory devices due to the difficulty of charge retention in the floating gate, as materials that allow for low energy direct tunneling of carriers into the floating gate/charge trapping layer typically allow for low energy direct back tunneling out due to the conduction band barrier levels or material thicknesses involved. Non-volatile floating gate/floating node memory cells and non-volatile memory devices of the present invention incorporate a band-gap engineered gate stack with asymmetric tunnel barriers and/or deep traps in the floating gate/charge trapping layer that allow the individual memory cells to be programmed and erased by direct tunneling charge transport and yet have a large barrier in place to promote charge retention and prevent back-tunneling of carriers.

Embodiments of the present invention allow for low voltage program and/or erase operations, reducing damage in the material of the device due to the tunneling/injection of high energy carriers through the insulator layers and decreasing write and erase operation power consumption. In addition, the low voltage operation allows for improved scaling by allowing the memory to employ low voltage layout and devices in the array. In another embodiment of the present invention, a low voltage single polarity program and erase operation via direct electron and efficient hole tunneling is utilized, eliminating the need to generate opposite polarity (typically negative) voltages for programming or erase operations and allowing the use of high efficiency low voltage charge pumps or simpler boot-strap circuitry to supply these operations.

The gate-stack of the embodiments of the present invention utilizes multiple layers of material that are band-gap engineered to form an asymmetric band-gap tunnel insulator layer which allows for direct tunneling to the trapping layer of the device, while maintaining the required long term charge retention. In particular, one embodiment of the present invention utilizes a tunnel insulator having multiple layers of tunnel insulator material in a stepped band-gap arrangement, facilitating direct tunneling of electrons from the channel to the floating gate/trapping layer to layer with a low applied field. The band-gap between the trapping layer and the tunnel insulator material (band offset) and the overall tunnel layer thickness in embodiments of the present invention is such that a large barrier is presented at the trapping layer and charge loss through direct tunneling (back-tunneling) is minimized, promoting good charge retention. In one embodiment of the present invention, deep quantum well traps (which can be, but are not limited to, implanted impurities, nano-crystals, or nano-dots) are provided in the trapping layer material to trap electrons and further increase the barrier to back-tunneling. In another embodiment of the present invention, a charge blocking insulation layer is provided that allows efficient hole tunneling from the control gate electrically neutralizing the trapped electrons to provide for memory cell erasure.

Programming memory cell embodiments of the present invention is accomplished by providing an elevated positive voltage, such as 5.5V, across the channel and the control gate to apply a field across the compound tunnel layer and induce direct tunneling of electrons from the channel to the trapping layer. During the programming operation, as more and more electrons are tunneled to the trapping layer, the charge associated with the trapped electrons begins to reduce the effective electrical field across the tunnel insulator layer and eventually halts direct tunneling upon reaching a steady state, self-limiting the memory cell programming process. In multi-bit storage, the voltage is applied between a selected source/drain region (with memory cell FET operating with the selected source/drain region acting as a source and the second source/drain region acting as the drain) and the control gate, tunneling electrons to the trapping layer directly adjacent to the selected source/drain region, the memory cell is then read by reversing the operational function of the first and second source/drain regions (the selected source/drain region acting as the drain and the second source/drain region acting as the source).

Erasure in memory cell embodiments of the present invention is accomplished by hole tunneling from the control gate to the trapping layer. In this form of erasure, a band-gap engineered charge blocking insulation layer is formed between the control gate and the trapping layer, which allows for efficient and enhanced tunneling of holes from the control gate to the trapping layer at further elevated channel-control gate voltage levels, such as 8.5V. At the above voltage level, an effective field is established across the charge blocking layer, between the electrons trapped in the charged trapping layer to the control gate, such that holes (which have a higher effective mass than electrons) are efficiently tunneled across the charge blocking layer. As more and more trapped electrons are compensated from the trapping layer by hole tunneling and trapping, the effective field between the control gate and the trapping layer across the charge blocking layer diminishes until the trapping layer is discharged or compensated (at this point, a balanced steady state of hole tunneling from the control gate and electron tunneling from the channel to the trapping layer is established). As a result of this balanced steady state, memory cell erasure is self-limiting and the possibility of memory cell overerasure diminished.

It is noted that memory cell erasure of embodiments of the present invention can also be accomplished by conventional hot-hole injection or Fowler-Nordheim tunneling with a negative voltage applied across the tunnel insulator layer.

Figure 1A:
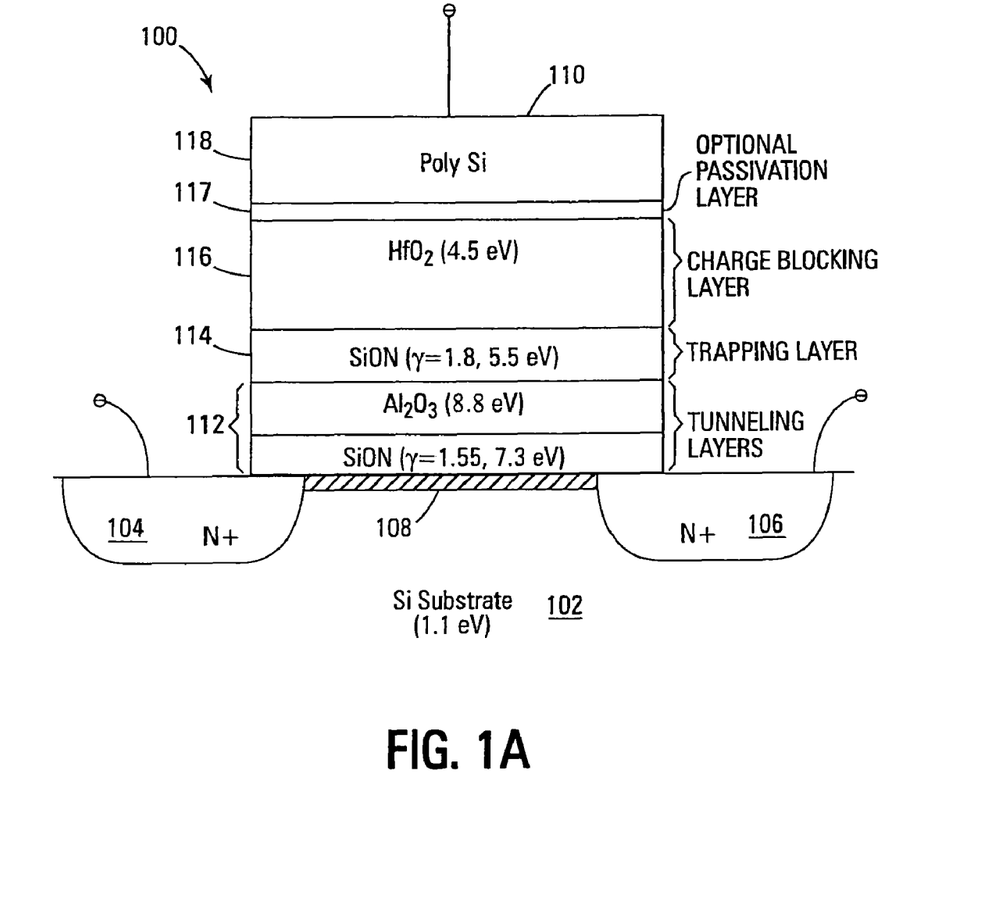
FIGS. 1A and 1B detail a memory cell and band diagram in accordance with embodiments of the present invention.

FIG. 1A details a memory cell 100 in accordance with embodiments of the present invention. In FIG. 1A, a NFET memory cell 100 is shown formed on a substrate 102. The memory cell 100 has a first and second source/drain regions 104, 106, in contact with a channel region 108, and a gate-stack 110 formed over the channel region 108. The gate-stack 110 contains a tunnel insulator layer 112, a trapping layer/floating gate 114, a charge blocking layer 116, an optional passivation layer 117, and a control gate 118. The tunnel insulator layer 112 includes two layers of materials layered to provide an asymmetric stepped band-gap profile and an overall effective oxide thickness (EOT) of 7 nm, as an example.

Specifically, in one embodiment, the tunnel insulator layer 112 contains two layers of material, a first layer of oxygen rich silicon oxy-nitride, SiON, having a conduction band-gap of approximately 7.3 eV and a refractive index of approximately $\gamma=1.55$ formed over the channel region 108 and silicon substrate 102, which has a conduction band-gap of 1.1 eV, and a second layer of alumina, $Al_2O_3$, having a band-gap of 8.8 eV, formed over the first layer of SiON. The typical physical thickness of each layer of the tunnel insulator would be approximately 1.5 nm with an effective oxide thickness (EOT) of <1.6 nm. The dielectric constants of the two layers are 5.5 and 10, respectively. The oxygen-rich silicon oxy-nitride has an atomic oxygen concentration of $>=46\%$, while its atomic silicon concentration is $<=33\%$. In another embodiment, the tunnel insulator layer 112 consists of three layers of material, a first layer of oxygen rich silicon oxy-nitride, SiON, having a conduction band-gap of 7.3 eV and a refractive index $\gamma=1.55$, a second layer of hafnium oxide ($HfO_2$) with a band-gap of 4.5 eV, and a third layer of oxygen rich silicon oxy-nitride, SiON, having a conduction band-gap of 7.3 eV and a refractive index $\gamma=1.55$ or silicon dioxide ($SiO_2$) with a band-gap of 9 eV and a refractive index $\gamma=1.46$.

The trapping layer 114 is formed of a layer of silicon-rich silicon oxy-nitride (SiON) with a refractive index of approximately $\gamma=1.8$ and a band-gap of approximately 5.5 eV to 5.7 eV. The silicon-rich silicon oxy-nitride has an atomic silicon concentration of approximately 38%-40%, an atomic oxygen concentration of approximately 20%, and an atomic nitrogen concentration of approximately 40%, resulting in a trapping layer with a dielectric constant of approximately 7.5 and a charge trap density of 8E12-1E13/cm2. In the above SiON, deep energy traps are associated with larger concentrations of Si—O—N bond "defects" in the silicon-rich silicon oxy-nitrides. The typical physical thickness of the layer of the trapping layer 114 would be approximately <5 nm. In another embodiment, the SiON trapping layer could be enhanced or replaced by a high density of silicon nano-crystals or metal nano-dots (such as gold or platinum nano-dots) to provide a larger cross section of deeper potential well traps (>>1E13/cm2).

The charge blocking layer 116 is formed of a high K dielectric (K=23) of hafnium oxide ($HfO_2$) with a band-gap of 4.5 eV that is approximately 15 nm thick and allows for erasure of the memory cell 100 by enhanced Fowler-Nordheim tunneling of holes from the (polysilicon or aluminum) control gate 118 to the trapping layer 114 due to its relatively low hole energy barrier. The control gate 118 is then typically formed of polysilicon or aluminum and may include an initial passivation layer 117, such as a thin layer of HfN, TaN or TiN, formed over the charge blocking layer 116. In alternative embodiments, the charge blocking layer 116 is formed of silicon nitride ($Si_3N_4$), $TiO_2$, or $Ta_2O_5$.

In another alternative embodiment of the present invention, the material charge blocking insulation layer 116 is formed of conventional insulation material, such as $SiO_2$ and is not selected to allow for erasure of the memory cell 100 by tunneling of holes from the control gate to the trapping layer 114 and the cell is erased by hot hole injection or Fowler-Nordheim tunneling through the tunnel insulator layer 112 from the substrate.

Figure 1B:
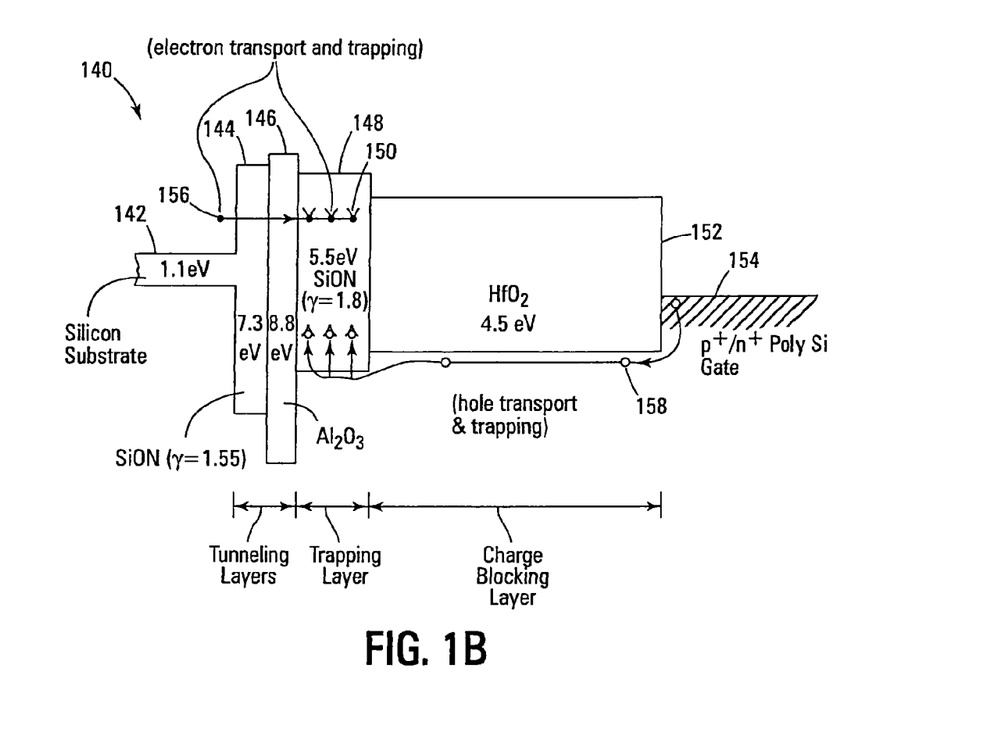

FIG. 1B details a band-gap diagram of the memory cell 100 of FIG. 1A. In FIG. 1B, the band-gap diagram electrons 156 are shown being transported via direct tunneling from the silicon substrate/channel 142 to deep well traps 150 in the silicon rich oxy-nitride, SiON, trapping layer 148 through the first layer of silicon rich silicon oxy-nitride, SiON, 144 and second layer of alumina, $Al_2O_3$, 146 of the tunnel insulator layer. In this transport, the electrons direct tunnel under the applied programming field from the silicon substrate/channel 142, with its band-gap of 1.1 eV, to the SiON layer of the tunnel insulator, with its band-gap of 7.3 eV, and then to the alumina layer with its band-gap of 8.8 eV, from which it then tunnels to the 5.5 eV band-gap SiON trapping layer 148. As the 5.5 eV band-gap SiON trapping layer 148 is 3.3 eV below the final 8.8 eV alumina tunnel insulator layer, a large potential barrier is present and back-tunneling is prevented from the trapping layer once the programming field is removed. In addition, the 5.5 eV band-gap SiON trapping layer 148 contains deep well trapping sites 150 to further contain the trapped electrons and lower the possibility of back-tunneling. As stated above, these deep well trapping sites 150 can be enhanced by the inclusion of deep well inducing materials or processes such as, but not limited to, nano-crystals or nano-dots of metal, silicon, nitride or other material with sufficient electron affinity, induced interface states, or charge trapping impurities.

As stated above, as the applied field across the gate-stack is increased, holes (which have a higher effective mass than electrons) are Fowler-Nordheim tunneled 158 from the control gate 154 across the charge blocking layer of hafnium oxide 152, which has a band-gap of 4.5 eV, to the 5.5 eV SiON charge trapping layer. In the SiON charge trapping layer, the holes combine with the trapped electrons and compensate the overall charge trapped in the trapping layer 148, effecting an erase functionality. As the charge trapped on the trapping layer 148 is reduced through electron-hole compensation/combination, the field across the hafnium oxide charge blocking layer 152 is reduced, reducing the overall rate of hole tunneling until the charge trapping layer 148 is erased and an equilibrium state is reached with electron tunneling to the charge trapping layer 148.

At a programming voltage of approximately 5.5 across the control gate and channel, the voltage drop across the tunnel layer is approximately 1.25V. The induced tunnel current would then quickly program the memory cell to a programmed high Vth state (Vth-high>4V) in a time period of approximately one microsecond. The tunneled charge would then be retained by the tunnel layer/trapping layer energy barrier and/or deep wells and prevent back-tunneling. At an erase voltage of approximately 8.5V-9V, the field across the charge blocking layer would be >=7 MV/cm, which induces hole injection and effects a fast erase cycle. During standby state, the charge due to trapped carriers on the trapping layer should be low (<7E5 V/cm) across the charge blocking layer to ensure minimal loss and high charge retention. Low average write/erase fields (<=7 MV/cm) also create high device endurance. Program and erase attributes for the memory cell detailed in FIGS. 1A and 1B will be Vprogramming: 5.5V at 1 μsec, Verase: 8.5V at 1 μsec, Vth-high>4V, Vth-low<=1V, Retention: >1E8 sec, and Endurance of >>1E10 program/erase cycles.

Figure 2:
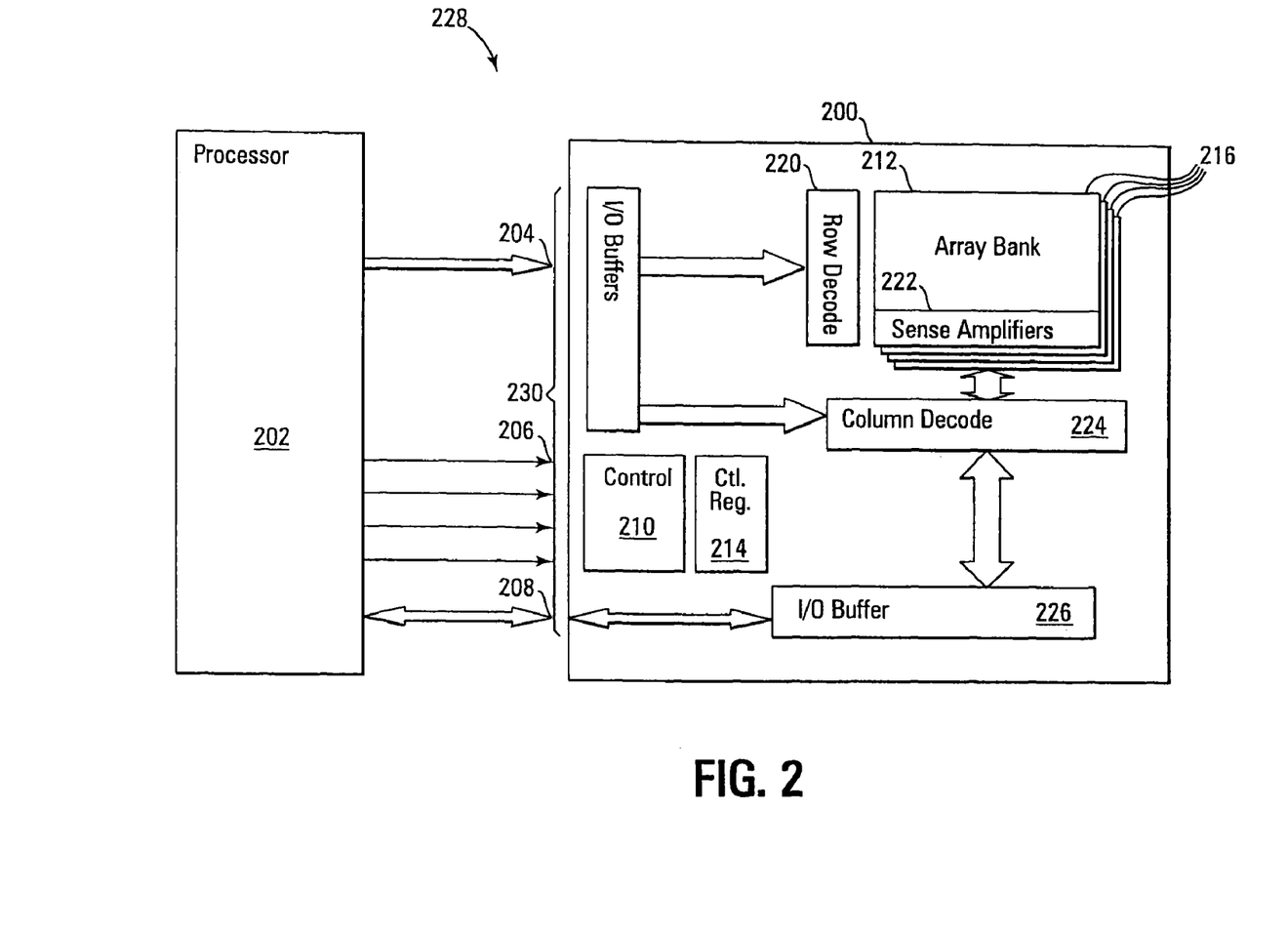
FIG. 2 details a system with a memory device in accordance with embodiments of the present invention.

FIG. 2 shows a simplified diagram of a system 228 incorporating a non-volatile memory device 200 of the present invention coupled to a host 202, which is typically a processing device or memory controller. In one embodiment of the present invention, the non-volatile memory 200 is a NOR architecture Flash memory device or a NAND architecture Flash memory device. The non-volatile memory device 200 has an interface 230 that contains an address interface 204, control interface 206, and data interface 208 that are each coupled to the processing device 202 to allow memory read and write accesses. It is noted that other memory interfaces 230 that can be utilized with embodiments of the present invention exist, such as a combined address/data bus, and will be apparent to those skilled in the art with the benefit of the present disclosure. In one embodiment of the present invention, the interface 230 is a synchronous memory interface, such as a SDRAM or DDR-SDRAM interface. Internal to the non-volatile memory device, an internal memory controller 210 directs the internal operation; managing the non-volatile memory array 212 and updating RAM control registers and non-volatile erase block management registers 214. The RAM control registers and tables 214 are utilized by the internal memory controller 210 during operation of the non-volatile memory device 200. The non-volatile memory array 212 contains a sequence of memory banks or segments 216. Each bank 216 is organized logically into a series of erase blocks (not shown). Memory access addresses are received on the address interface 204 of the non-volatile memory device 200 and divided into a row and column address portions.

On a read access the row address is latched and decoded by row decode circuit 220, which selects and activates a row/page (not shown) of memory cells across a selected memory bank. The bit values encoded in the output of the selected row of memory cells are coupled to a local bit line (not shown) and a global bit line (not shown) and are detected by sense amplifiers 222 associated with the memory bank. The column address of the access is latched and decoded by the column decode circuit 224. The output of the column decode circuit 224 selects the desired column data from the internal data bus (not shown) that is coupled to the outputs of the individual read sense amplifiers 222 and couples them to an I/O buffer 226 for transfer from the memory device 200 through the data interface 208.

On a write access the row decode circuit 220 selects the row page and column decode circuit 224 selects write sense amplifiers 222. Data values to be written are coupled from the I/O buffer 226 via the internal data bus to the write sense amplifiers 222 selected by the column decode circuit 224 and written to the selected non-volatile memory cells (not shown) of the memory array 212. The written cells are then reselected by the row and column decode circuits 220, 224 and sense amplifiers 222 so that they can be read to verify that the correct values have been programmed into the selected memory cells.

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

An EEPROM or Flash NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 3A:
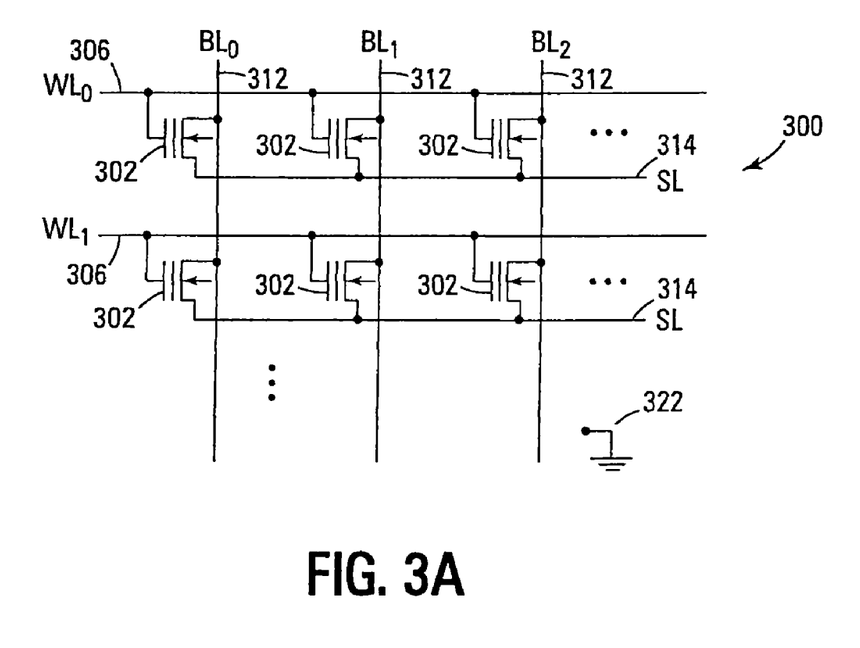
FIGS. 3A and 3B detail NOR and NAND architecture memory arrays in accordance with embodiments of the present invention.

FIG. 3A shows a simplified NOR floating gate memory array 300 of a EEPROM or Flash memory device of an embodiment of the present invention. In FIG. 3A, a NOR array 300 couples floating gate memory cells 302 of embodiments of the present invention to bit lines 312, source lines 314, word lines 306, and a substrate connection 222. In forming the NOR array 300, the bit lines 312 and source lines 314 are typically formed locally from N+ doped regions deposited in the substrate and are separated by a channel region. Each memory cell FET 302 has a gate-insulator stack formed over the channel region and between the N+ doped regions of a bit line 312 and a source line 314, utilizing the N+ doped regions as a drain and source respectively (it is noted that the source line 314 may be replaced with a second bit line 312 connection in multi-bit cell arrays, so that the current flow through the memory cell may be reversed). As described above, the gate-insulator stack is made of a tunnel insulator layer formed on top of the channel region, a floating gate/trapping layer formed on the tunnel insulator, charge blocking insulator layer formed over the trapping layer, and a control gate 306 (typically formed integral to the word line 306, also known as a control gate line) formed over the charge blocking insulator. It is noted that other NOR architecture memory array 300 configurations incorporating embodiments of the present invention are possible and will be apparent to those skilled in the art with the benefit of the present disclosure.

Figure 3B:
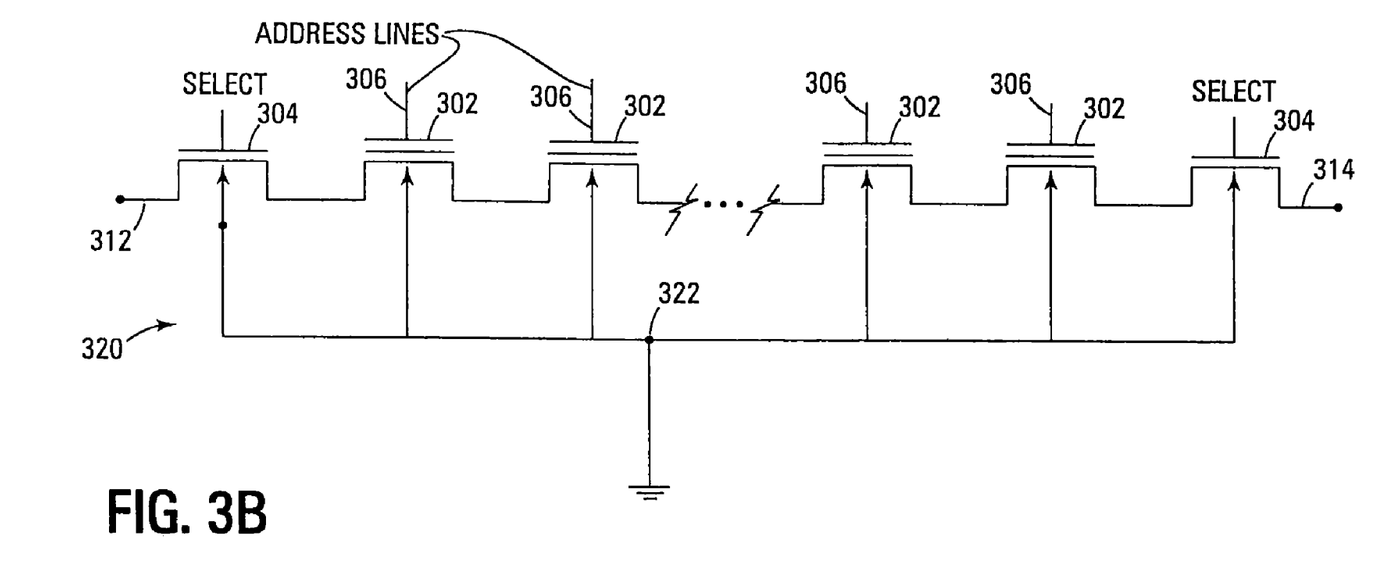

FIG. 3B details a simplified NAND memory string 320 of a NAND architecture EEPROM or Flash memory device of an embodiment of the present invention. In FIG. 3B, a series of floating gate memory cells 302 are coupled together source to drain to form a NAND string 320 (typically of 8, 16, 32, or more cells). Each memory cell FET 302 has a gate-insulator stack that is made of a tunnel insulator layer on top of the substrate, a floating gate/trapping layer formed on the tunnel insulator layer, charge blocking insulator layer formed over the trapping layer, and a control gate 306 (typically formed in a control gate line, also known as a word line) formed over the charge blocking layer. N+ doped regions are formed between each gate insulator stack to form the source and drain regions of the adjacent floating gate memory cells, which additionally operate as connectors to couple the cells of the NAND string 320 together. Optional select gates 304, that are coupled to gate select lines, are formed at either end of the NAND floating gate string 320 and selectively couple opposite ends of the NAND floating gate string 320 to a bit line 312 and a source line 314. In a NAND memory array, the NAND architecture memory string 320 of FIG. 3B would be coupled to bit lines 312, source lines 314, word lines 306, and a substrate connection 222.

As stated above, although floating gate memory cells of embodiments of the present invention are self-limiting in charge removal during erasure, it is possible, for too much charge to be removed from the floating gate/trapping layer of a floating gate memory cell transistor placing it in to an "overerased" state. In such cases, enough charge is removed that the threshold voltage of the floating gate memory cell transistor is altered so that it operates as a depletion mode device, requiring a negative control gate-channel voltage to be applied to shut off current flow. In this state, the floating gate memory cell transistor will flow a current even when it has not been selected by the memory, unless a negative voltage is applied to the control gate with respect to the source. This "overerased" state and the resulting current flow when the overerased floating gate memory cell is unselected can interfere with attempts to read the values of other floating gate memory cells that share the common bit lines with it, corrupting the read data.

Complicating the issue of overerasure in floating gate memory cells is that not all floating gate memory cells erase (remove charge from their floating gates) at the same rate of speed. Typically, one or more "fast erasing" memory cells will erase more quickly than the others of the group of cells selected for erasure. To minimize the possibility of inadvertently overerasing this group of fast erasing floating gate memory cells most EEPROM and Flash memory devices/arrays typically utilize the complex and time consuming iterative erase voltage pulse-memory cell verify process noted above to erase its floating gate memory cells. Additionally, the current flow results in consumption of excessive power in the standby state.

An additional issue that can affect the memory cells of an EEPROM or Flash memory array is "disturb." Disturb typically happens when the elevated voltages used to program or erase a floating gate memory cell segment or erase block "disturb" the programmed values stored in other floating gate memory cells, or, in charge trapping layers or multi-bit storage, move the "centroid" of the trapped charge, corrupting the stored data bits and causing errors when they are later read. It is also possible to disturb memory cells during read operations, particularly in NAND architecture memory arrays with their close cell placement and elevated read voltages. These inadvertently disturbed cells typically share common word lines, bit lines, source lines, or physical placement with the memory cells that are being programmed or erased.

Figure 4A:
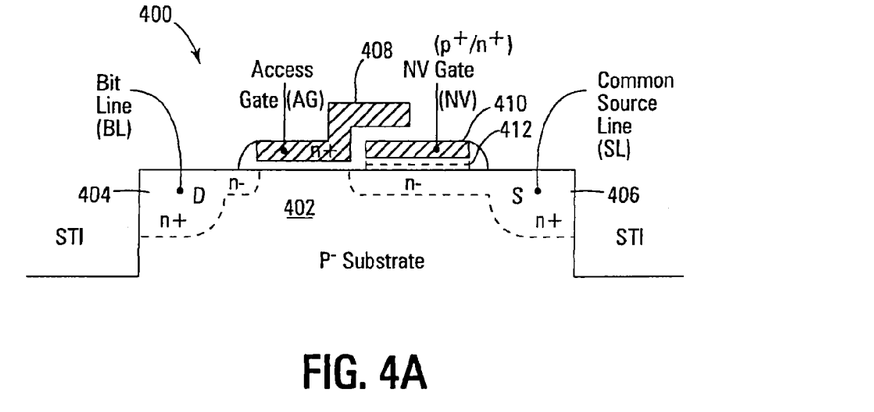
FIGS. 4A and 4B detail multi-gate NOR and NAND memory cells and strings in accordance with embodiments of the present invention.

FIG. 4A details an NFET multi-gate memory cell 400 of one embodiment of the present invention that incorporates a non-volatile gate and an integral select gate. In FIG. 4A, the multi-gate memory cell 400 contains a N+ drain/bit line region 404 and a N+ source/source line region 406 formed on a P doped substrate 402. A fixed threshold voltage access transistor 408 is formed beside a bi-stable threshold voltage non-volatile memory cell FET 410, the joined channel of which couples the drain region 404 and the source region 406. The non-volatile memory cell FET 410 contains a gate-stack 412 that contains an asymmetric band-gap tunnel insulator layer, a charge trapping layer, a charge blocking insulator layer, and control gate of an embodiment of the present invention. The access gate of the access transistor 408 overlaps the control gate/gate-stack 412 of the non-volatile memory cell 410. The integral access gate 408 of the multi-gate memory cell 400 controls access to the non-volatile memory cell 410 and allows it to be isolated from the bit line 404. This isolation capability allows the isolation of any overerased or write fatigued memory cells from the bit line 404 so they do not affect read data values and helps minimize disturb of the memory cell 410 during program, read and erase operations. It is noted that a lightly doped N− region can be optionally inserted as shown under the non-volatile memory cell 410 to ensure that a pre-existing channel of electrons is present to tunnel electrons from. In one example embodiment, the programming voltage potentials at the various nodes are V-AG=Vdd, V-NV=5.5V, V-BL=0.25V, V-SL=Vdd, V-Sub=0V, and the erase voltage potentials are V-AG=Vdd, V-NV=8.5V, V-BL=open, V-SL=0V, V-Sub=0V.

Figure 4B:
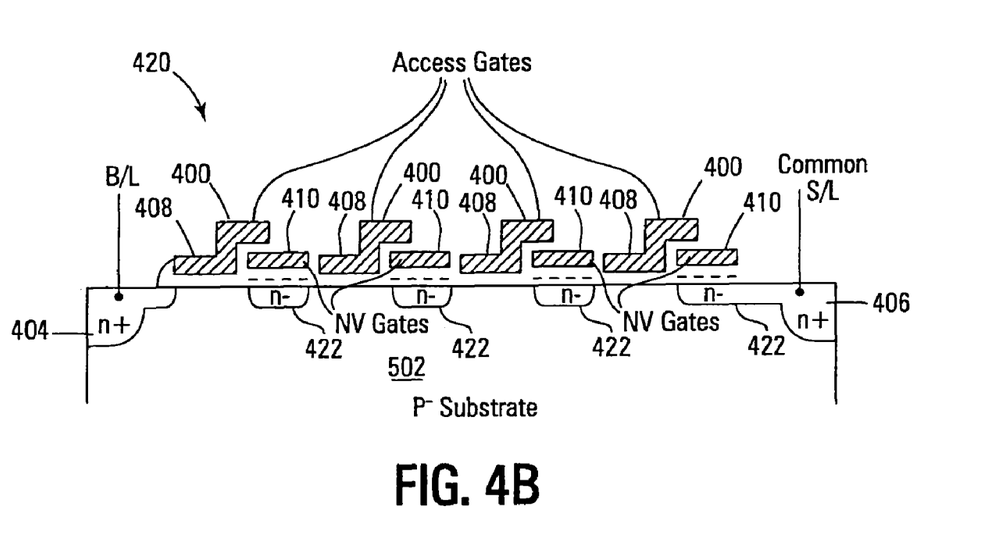

FIG. 4B details a NAND memory string 420 of one embodiment of the present invention that incorporates multi-gate memory cells 400. As described above, in reference to FIG. 4A, multi-gate memory cells incorporate an integral non-volatile gate and select gate. In the NAND memory string 420 of FIG. 4B, a series of multi-gate memory cells 400 are formed on a P doped substrate 402 and coupled together source to drain to form a NAND string 420 (as stated above, typically of 8, 16, 32, or more cells in a string) coupled to a drain/bit line region 404 and a N+ source/source line region 406. Each multi-gate memory cell 400 contains a fixed threshold voltage access transistor 408 formed beside a bi-stable threshold voltage non-volatile memory cell FET 410. The multi-gate memory cells are joined the adjacent cell 400 by a N− drain/channel/source region 422. The non-volatile memory cell FET 410 contains a gate-stack that contains an asymmetric band-gap tunnel insulator layer, a charge trapping layer, a charge blocking insulator layer, and control gate of an embodiment of the present invention with or without a passivation layer. The access gate of the access transistor 408 overlaps the control gate/gate-stack of the non-volatile memory cell 410. The integral access gate 408 of the multi-gate memory cell 400 controls access to the non-volatile memory cell 410 and allows it to be isolated.

Figure 5:
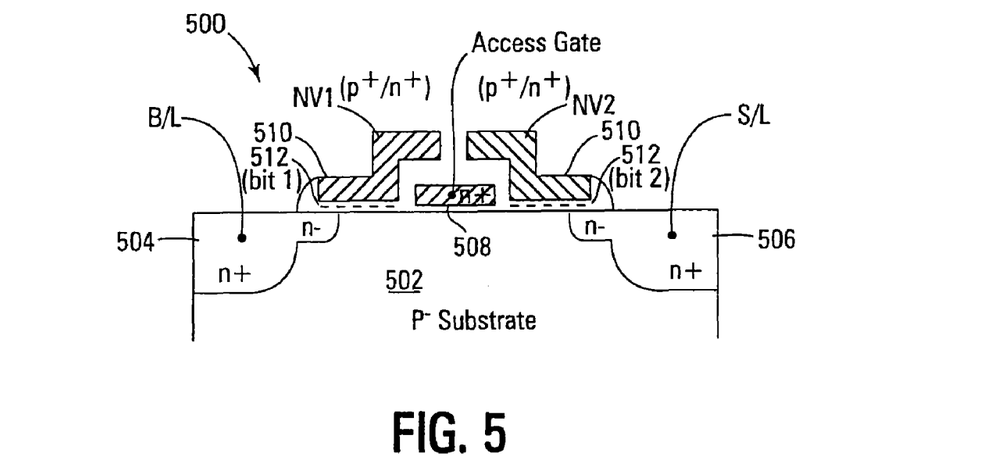
FIG. 5 details a twin storage element memory cell in accordance with embodiments of the present invention.

FIG. 5 details an NFET 2-bit memory cell 500 of one embodiment of the present invention that incorporates two non-volatile gates and an integral select gate. In FIG. 5, the multi-gate memory cell 500 contains a N+ drain/bit line region 504 and a N+ source/source line region 506 separated by a channel region 514 are formed on a P doped substrate 502. A first non-volatile memory cell FET 510 is formed and is separated from a second non-volatile memory cell FET 510 by a central fixed threshold voltage access transistor 508, all formed over the channel region 514 which couples the drain region 504 and the source region 506. The first and second non-volatile memory cell FETs 510 contains a gate-stack 512 with an asymmetric band-gap tunnel insulator layer, a charge trapping layer, a charge blocking insulator layer, and control gate of an embodiment of the present invention. The control gates of both the first and second non-volatile memory cell FET's slightly overlap the access gate of the access transistor 508. The integral access gate 508 of the 2-bit multi-gate memory cell 500 controls access to the first and second non-volatile memory cells 510 and allows them to be isolated. This isolation capability allows the isolation of any over-erased or write fatigued memory cells from the bit line 504 and source line 506 so they do not affect read data values and helps minimize disturb of the memory cell 510 during program, read and erase operations.

It is also noted that other memory cells, memory strings, arrays, and memory devices in accordance with embodiments of the present invention are possible and should be apparent to those skilled in the art with benefit of the present disclosure.

CONCLUSION

Non-volatile memory devices and arrays have been described that utilize asymmetric band-gap engineered gate stacks with asymmetric tunnel barriers in floating gate memory cells in NOR or NAND memory architectures that allow for direct tunneling programming and erase with electrons and holes, while maintaining high charge blocking barriers and deep carrier trapping sites for good charge retention. The direct tunneling program and erase capability reduces damage to the gate stack and the crystal lattice from high energy carriers, reducing write fatigue and leakage issues and enhancing device lifespan. Memory cell embodiments of the present invention also allow multiple bit storage in a single memory cell, and allow for programming and erase with reduced voltages. A memory cell that allows for a positive voltage erase process via hole tunneling is also provided.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory cell, comprising:
a control gate;
a charge trapping material; and
a charge blocking material between the control gate and the charge trapping material;
wherein the charge blocking material is configured to allow for erasure of the memory cell by enhanced F-N tunneling of holes from the control gate to the charge trapping material; and
wherein the charge trapping material comprises silicon-rich silicon oxy-nitride.

2. The memory cell of claim 1, wherein the charge blocking material is further configured to provide a steady state of hole tunneling from the control gate to the charge trapping material that is balanced with a steady state of electron tunneling from a channel of the memory cell to the charge trapping material such that a self-limiting erasure is obtained.

3. The memory cell of claim 1, wherein the charge blocking material is selected from the group consisting of hafnium oxide, silicon nitride, titanium oxide and tantalum oxide.

4. A memory cell, comprising:
a control gate;
a channel;
a charge trapping material between the control gate and the channel;
a charge blocking material between the control gate and the charge trapping material; and
a tunnel insulator material between the charge trapping material and the channel;
wherein the charge blocking material is configured to allow for erasure of the memory cell by enhanced F-N tunneling of holes from the control gate to the trapping material; and
wherein the tunnel insulator material comprises oxygen-rich silicon oxy-nitride adjacent the channel.

5. A memory cell, comprising:
a control gate;
a channel;
a charge trapping material between the control gate and the channel;
a charge blocking material between the control gate and the charge trapping material; and
a tunnel insulator material between the charge trapping material and the channel;
wherein the charge blocking material is configured to allow for erasure of the memory cell by enhanced F-N tunneling of holes from the control gate to the trapping material; and
wherein the charge trapping material comprises silicon-rich silicon oxy-nitride.

6. The memory cell of claim 5, wherein the tunnel insulator material is configured to allow for direct tunneling of electrons from the channel to the charge trapping material.

7. A memory cell, comprising:
a control gate;
a channel;
a charge trapping material between the control gate and the channel;
a charge blocking material between the control gate and the charge trapping material; and
a tunnel insulator material between the charge trapping material and the channel;
wherein the charge blocking material is configured to allow for erasure of the memory cell by enhanced F-N tunneling of holes from the control gate to the trapping material; and
wherein the tunnel insulator material comprises oxygen-rich silicon oxy-nitride adjacent the channel and alumina between the oxygen-rich silicon oxy-nitride and the charge trapping material.

8. A memory cell, comprising:
a control gate;
a channel;
a charge trapping material between the control gate and the channel;
a charge blocking material between the control gate and the charge trapping material; and
a tunnel insulator material between the charge trapping material and the channel;
wherein the charge blocking material is configured to allow for erasure of the memory cell by enhanced F-N tunneling of holes from the control gate to the trapping material; and
wherein the tunnel insulator material comprises oxygen-rich silicon oxy-nitride adjacent the channel, a silicon material selected from the group consisting of oxygen-rich silicon oxy-nitride and silicon dioxide adjacent the charge trapping material, and hafnium oxide between the oxygen-rich silicon oxy-nitride adjacent the channel and the silicon material.

9. The memory cell of claim 4, wherein a portion of the tunnel insulator material adjacent the charge trapping material has a band-gap that is greater than a band-gap of the charge trapping material.

10. The memory cell of claim 9, wherein a portion of the tunnel insulator material adjacent the channel has a band-gap that is less than the band-gap of the portion of the tunnel insulator material adjacent the charge trapping material.

11. A memory cell, comprising:
   a control gate;
   a charge trapping material; and
   a charge blocking material between the control gate and the charge trapping material;
   wherein the charge blocking material is a high-K dielectric material;
   wherein the charge blocking material is configured to allow for erasure of the memory cell by enhanced F-N tunneling of holes from the control gate to the charge trapping material; and
   wherein the charge trapping material comprises silicon-rich silicon oxy-nitride.

12. The memory cell of claim 11, wherein the charge blocking material is further configured to provide a steady state of hole tunneling from the control gate to the charge trapping material that is balanced with a steady state of electron tunneling from a channel of the memory cell to the charge trapping material such that a self-limiting erasure is obtained.

13. The memory cell of claim 11, wherein the high-K dielectric material is selected from the group consisting of hafnium oxide, silicon nitride, titanium oxide and tantalum oxide.

14. A memory cell, comprising:
   a control gate;
   a charge trapping material; and
   a charge blocking material between the control gate and the charge trapping material;
   wherein the charge blocking material is a high-K dielectric material;
   wherein the charge blocking material is configured to allow for erasure of the memory cell by enhanced F-N tunneling of holes from the control gate to the charge trapping material; and
   wherein the control gate comprises a conductive material selected from the group consisting of polysilicon and aluminum, wherein the charge trapping material comprises silicon-rich silicon oxy-nitride, and wherein the high-K dielectric material is selected from the group consisting of hafnium oxide, silicon nitride, titanium oxide and tantalum oxide.

15. The memory cell of claim 14, further comprising a passivation layer between the control gate and the charge blocking material.

16. A memory cell, comprising:
   a control gate;
   a channel;
   a charge trapping material between the control gate and the channel;
   a charge blocking material between the control gate and the charge trapping material; and
   an asymmetric tunnel insulator material between the charge trapping material and the channel;
   wherein the charge blocking material is selected from the group consisting of hafnium oxide, silicon nitride, titanium oxide and tantalum oxide;
   wherein the charge blocking material is configured to allow for erasure of the memory cell by enhanced F-N tunneling of holes from the control gate to the trapping material; and
   wherein the tunnel insulator material comprises oxygen-rich silicon oxy-nitride adjacent the channel.

17. The memory cell of claim 16, wherein the asymmetric tunnel insulator material has a band-gap at a portion adjacent the charge trapping material that is greater than a band-gap of the charge trapping material, wherein the charge-trapping material has a band-gap that is greater than a band-gap of the charge blocking material.

18. A memory cell, comprising:
   a control gate;
   a channel;
   a charge trapping material between the control gate and the channel;
   a charge blocking material between the control gate and the charge trapping material; and
   an asymmetric tunnel insulator material between the charge trapping material and the channel;
   wherein the charge blocking material is selected from the group consisting of hafnium oxide, silicon nitride, titanium oxide and tantalum oxide;
   wherein the charge blocking material is configured to allow for erasure of the memory cell by enhanced F-N tunneling of holes from the control gate to the trapping material; and
   wherein the tunnel insulator material comprises oxygen-rich silicon oxy-nitride adjacent the channel and alumina between the oxygen-rich silicon oxy-nitride and the charge trapping material.

19. A memory cell, comprising:
   a control gate;
   a channel;
   a charge trapping material between the control gate and the channel;
   a charge blocking material between the control gate and the charge trapping material; and
   an asymmetric tunnel insulator material between the charge trapping material and the channel;
   wherein the charge blocking material is selected from the group consisting of hafnium oxide, silicon nitride, titanium oxide and tantalum oxide; and
   wherein the charge blocking material is configured to allow for erasure of the memory cell by enhanced F-N tunneling of holes from the control gate to the trapping material; and
   wherein the tunnel insulator material comprises oxygen-rich silicon oxy-nitride adjacent the channel, silicon dioxide adjacent the charge trapping material, and hafnium oxide between the oxygen-rich silicon oxy-nitride and the silicon dioxide.

20. The memory cell of claim 16, wherein a portion of the tunnel insulator material adjacent the charge trapping material has a band-gap that is greater than a band-gap of the charge trapping material, and wherein a portion of the tunnel insulator material adjacent the channel has a band-gap that is less than the band-gap of the portion of the tunnel insulator material adjacent the charge trapping material.

* * * * *